(12) United States Patent
Koller et al.

(10) Patent No.: US 7,294,288 B2
(45) Date of Patent: Nov. 13, 2007

(54) PROCESS OF PREPARING REGIOREGULAR POLYMERS

(75) Inventors: Guntram Koller, Darmstadt (DE); Birgit Falk, Riedstadt (DE); Clarissa Weller, Darmstadt (DE); Mark Giles, Bitterne Park (GB); Iain McCulloch, Chandlers Ford (GB)

(73) Assignee: Merck Patent Gesellschaft mit beschrankter Haftung, Darmstadt (DE)

(*) Notice: Subject to any disclaimer, the term of this patent is extended or adjusted under 35 U.S.C. 154(b) by 487 days.

(21) Appl. No.: 10/912,564

(22) Filed: Aug. 6, 2004

(65) Prior Publication Data
US 2005/0080219 A1  Apr. 14, 2005

Related U.S. Application Data

(60) Provisional application No. 60/493,451, filed on Aug. 8, 2003.

(30) Foreign Application Priority Data
Aug. 6, 2003 (EP) ................... 03017920

(51) Int. Cl.
*H01B 1/00* (2006.01)
*C08G 75/00* (2006.01)
*C08G 75/32* (2006.01)

(52) U.S. Cl. ............ 252/500; 528/373; 528/377; 528/378; 528/379

(58) Field of Classification Search ......... 528/379, 528/373; 252/500
See application file for complete search history.

(56) References Cited

U.S. PATENT DOCUMENTS

| 4,508,639 A | 4/1985 | Camps et al. |
| 4,521,589 A | 6/1985 | Yamamoto et al. |
| 4,711,742 A | 12/1987 | Jen et al. |
| 4,737,557 A | 4/1988 | Sato et al. |
| 5,198,153 A | 3/1993 | Angelopoulos et al. |

(Continued)

FOREIGN PATENT DOCUMENTS

EP  0528662  2/1993

(Continued)

OTHER PUBLICATIONS

Yamamoto et al., "Preparation of Thermostable and Electric-Conducting Poly(2,5-Thienylene)," Journal of Polymer Science, Polymer Letters Ed., vol. 18, 1980, pp. 9-12.

(Continued)

*Primary Examiner*—Douglas McGinty
*Assistant Examiner*—Jaison Thomas
(74) *Attorney, Agent, or Firm*—Millen, White, Zelano & Branigan, P.C.

(57) ABSTRACT

The invention relates to a process of preparing regioregular polymers, in particular head-to-tail (HT) poly-(3-substituted) thiophenes with high regioregularity, to novel polymers prepared by this process, to the use of the novel polymers as semiconductors or charge transport materials in optical, electrooptical or electronic devices including field effect transistors (FETs), electroluminescent, photovoltaic and sensor devices, to FETs and other semiconducting components or materials comprising the novel polymers, to a process of endcapping polymers and to endcapped polymers obtained thereof and their use in the above devices.

44 Claims, 5 Drawing Sheets

U.S. PATENT DOCUMENTS

| | | | |
|---|---|---|---|
| 5,540,999 | A | 7/1996 | Yamamoto et al. |
| 5,756,653 | A | 5/1998 | Rieke |
| 5,892,244 | A | 4/1999 | Tanaka et al. |
| 5,998,804 | A | 12/1999 | Suh et al. |
| 6,166,172 | A | 12/2000 | McCullough et al. |
| 6,602,974 | B1 | 8/2003 | McCullough et al. |
| 7,112,649 | B2 * | 9/2006 | Liu et al. ............ 528/373 |
| 2003/0062509 | A1 | 4/2003 | Heeney et al. |

FOREIGN PATENT DOCUMENTS

| | | |
|---|---|---|
| EP | 0889350 | 1/1999 |
| EP | 1028136 | 8/2000 |
| EP | 1398336 | 3/2004 |
| WO | WO 9621659 | 7/1996 |
| WO | WO 0079617 | 12/2000 |

OTHER PUBLICATIONS

Loewe et al., "Regioregular, Head-to-Tail Coupled Poly(3-alkylthiophenes) Made Easy by the GRIM Method: Investigation of the Reaction and the Origin of Regioselectivity," Macromolecules, 2001, 34, p. 4324-4333 (Published on web, May 19, 2001).

Yamamoto et al., "Preparation of pi-Conjugated Poly(thiophene-2,5-diyl), Poly(p-phenylene), and Related Polymers Using Zerovalent Nickel Complexes. Linear Structure and Properties of the pi-Conjugated Polymers," Macromolecules, 1992, 25, pp. 1214-1223.

Mao et al., "Synthesis and Structure-Property Relationships of Regioirregular Poly(3-hexylthiophenes)" Macromolecules, 1993, 26, pp. 1163-1169.

Elsenbaumer et al., "Processible, Environmentally Stable, Highly Conductive Forms of Polythiophene," Synthetic Metals, 18 (1987), 277-282.

Stein et al., "NMR Studies of Poly(3-Alkylthiophenes)," Synthetic Metals, 41-43 (1991) pp. 559-562.

Michael Karas and Franz Hillenkamp, "Laser Desorption Ionization of Proteins with Molecular Masses Exceeding 10 000 Daltons," Anal. Chem., 1988, pp. 2299-2301, vol. 60.

David Mueller et al., "Novel Cross-linkable hole-transport monomer for use in organic light emitting diodes," Synthetic metals 111-112, 2000, pp. 31-34.

Henning Sirringhaus et al., "Integrated Optoelectronic Devices Based on Conjugated Polymers," Science, Jun. 12, 1998, pp. 1741-1744, vol. 280.

H. Sirringhaus et al., "Two-dimensional charge transport in self-organized, high-mobility conjugated polymers," Nature, Oct. 14, 1999, vol. 401.

H. Sirringhaus et al., "Microstructure-mobility correlation in self-organised, conjugated polymer field-effect transistors," Synthetic Metals 111-112, 2000, pp. 129-132.

Richard D. McCullough, "The chemistry of conducting Polythiophenes," Advanced Materials, 1998, pp. 93-116, vol. 10, No. 2.

Robert Loewe et al., "A simple method to prepare head-to-tail coupled, regioregular poly(3-alkylthiophenes) using Grignard Metathesis," Advanced Materials, 1999, pp. 250-253, vol. 11, No. 3.

J. P. Montheard and T. Pascal, "New semiconducting polymers from aromatic and heterocyclic nuclei and their doping with iodine," Synthetic Metals, 1984, pp. 389-396, vol. 9.

M. Kobayashi et al., "Synthesis and properties of chemically couple poly(thiophene)," Synthetic Metals, 1984, pp. 77-86, vol. 9.

Takakazu Yamamoto et al., "Preparation and Characterization of Poly(thioenylene)s," The Chemical Society of Japan, 1983, pp. 1497-1502, Bull. Chem. Soc. Jpn., pp. 1497-1502, vol. 56.

R. L. Elsenbaumer et al., "Processible and Environmentally Stable Conducting Polymers," Synthetic Metals, 1986, pp. 169-174, vol. 15.

Kwan-Yue Jen et al., "Highly conducting, soluble, and environmentally-stable poly(3-alkylthiophenes)," J. Chem. Soc., Chem. Commun., 1986; pp. 1346-1347.

P. C. Stein et al., "NMR study of the structural defects in poly(3-alkylthiophene)s: influence of the polymerization method," Synthetic Metals, 1995, pp. 305-306, vol. 69.

Huanyu Mao et al., "Grignard synthesis of π-conjugated ploy(3-alkylthiophenes): controlling molecular weights and the nature of terminal units," Macromolecules, 1992, pp. 554-558, vol. 25, American Chemical Society.

Bea M. W. Langeveld-Voss et al., End-group modification of regioregular poly(3-alkylthiophene)s, Chem. Commun., The Royal Society of Chemistry, 2000, pp. 81-82.

Jinsong Liu et al., "Employing MALDI-MS on poly(alkylthiophenes): Analysis of Molecular Weights, Molecular Weight Distributions, End-group Structures, and End-group Modifications," Macromolecules, 1999, pp. 5777-5785, 32.

Yamamoto et al.; "Preparation of Thermostable and Electric-Conducting Poly(2,5-Thienylene," Journal of Polymer Science, Polymer Letters Ed., vol. 18, 1980, pp. 9-12.

Loewe et al.; "Regioregular, Head-to-Tail Coupled Poly(3-alkylthiophenes) Made Easy by the GRIM Method: Investigation of the Reaction and the Origin of Regioselectivity" Macromolecules, 2001, 34, pp. 4324-4333 (published on web, May 19, 2001).

Yamamoto et al., "Preparation of pi-Conjugated Poly(thiophene-2,5-diyl), . . . Linear Structure and Properties of the pi-Conjugated Polymers," Macromolecules, 1992, 25, pp. 1214-1223.

Mao et al.; "Synthesis and Structure-Property Relationships of Regioirregular Poly(3-hexylthiophenes)" Macromolecules, 1993, 26, pp. 1163-1169.

Elsenbaumer et al., "Processible, Environmentally Stable, Highly Conductive Forms of Polythiophene" Synthetic Metals, 18 (1987), 277-282.

Stein et al., "NMR Studies of Poly(3-Alkylthiophenes)" Synthetic Metals, 41-43 (1991) pp. 559-562.

Liaohai Chen et al., "Highly sensitive biological and chemical sensors based on reversible fluorescence quenching in a conjugated polymer," PNAS, Oct. 26, 1999, pp. 12287-12292, vol. 96, No. 22.

Deli Wang et al., "Biosensors from conjugated polyelectrolyte complexes," PNAS, Jan. 8, 2002, pp. 49-53, vol. 99, No. 1.

Nicolas DiCesare et al., "Saccharide detection based on the amplified fluorescence quenching of a water-soluble poly(phenylene ethynylene) by a Boronic Acid functionalized Benzyl Viologen Derivative," 2002, Langmuir, pp. 7785-7787, vol. 18.

D. Tyler McQuade et al., "Conjugated polymer-based Chemical Sensors," Chem. Rev., 2000, pp. 2537-2574, vol. 100.

Howard E. Katz et al., "Synthetic chemistry for ultrapure, processable, and high-mobility organic transistor semiconductors," Acc. Chem., 2001, pp. 359-369, vol. 34., No. 5.

Ahmed Iraqi et al., "Synthesis and characterization of telechelic regioregular head-to-tail poly(3-alkylthiophenes)," J. Mater. Chem., 1998, pp. 25-29, vol. 8, No. 1.

Christoph Weder et al., "Incorporation of photoluminescent polarizers into liquid crstal displays," Science, Feb. 6, 1998, vol. 279.

Dirk J. Broer et al., "In-situ photopolymerization of oriented liquid-crystalline acrylates, 5a: Influence of the alkylene spacer on the properties of the mesogenic monomers and the formation and properties of oriented polymer networks," Makromol. Chem. 1991, pp. 59-74, vol. 192.

C. Sanchez et al., "Photoluminescence stability of a cyanoterphenyl chromophore in liquid crystalline polymeric systems," Journal of Applied Physics, Dec. 15, 2000, pp. 7124-7128, vol. 88, No. 12.

S. Guillerez et al., "New convenient synthesis of highly regioregular poly(3-octylthiophene) based on the Suzuki coupling reaction," Synthetic Metals, 1998, pp. 123-126, vol. 93.

K. Y. Jon et al., "Processible and environmentally stable conducting polymers," Polymer Laboratory, pp. 78-83, Allied Corporation, Morristown, NJ 07960, no date available.

* cited by examiner

PROCESS OF PREPARING REGIOREGULAR POLYMERS

This application claims the benefit of the filing date of U.S. Provisional Application Ser. No. 60/493,451 filed Aug. 8, 2003 which is incorporated by reference herein.

FIELD OF INVENTION

The invention relates to a process of preparing regioregular polymers, in particular head-to-tail (HT) poly-(3-substituted) thiophenes with high regioregularity, and to novel polymers prepared by this process. The invention further relates to the use of the novel polymers as semiconductors or charge transport materials in optical, electrooptical or electronic devices including field effect transistors (FETs), electroluminescent, photovoltaic and sensor devices. The invention further relates to FETs and other semiconducting components or materials comprising the novel polymers. The invention further relates to a process of endcapping polymers, to polymers obtained by this process, and to their use in the above devices.

BACKGROUND AND PRIOR ART

Organic materials have recently shown promise as the active layer in organic based thin film transistors and organic field effect transistors (OFETs) [see H. E. Katz, Z. Bao and S. L. Gilat, *Acc. Chem. Res.*, 2001, 34, 5, 359]. Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semiconducting material and the current on/off ratio, so the ideal semiconductor should have a low conductivity in the off state, combined with a high charge carrier mobility ($>1 \times 10^{-3}$ $cm^2V^{-1}$ $s^{-1}$). In addition, it is important that the semiconducting material is relatively stable to oxidation i.e. it has a high ionisation potential, as oxidation leads to reduced device performance.

There is a need for an improved method of preparing polymers, particularly poly-(3-substituted) thiophenes with high regioregularity, high molecular weight, high purity and high yields in an economical, effective and environmentally beneficial way, which is especially suitable for industrial large scale production.

It was an aim of the present invention to provide an improved process for preparing polymers with these advantages, but not having the drawbacks of prior art methods mentioned above.

Other aims of the present invention are immediately evident to the person skilled in the art from the following detailed description.

The inventors of the present invention have found that these aims can be achieved, and the above problems be solved, by providing a process of preparing polymers, in particular poly-(3-substituted) thiophenes according to the present invention as described below. According to this process, a 3-substituted thiophene monomer with at least two groups, wherein these groups are leaving groups that are capable of reacting with magnesium, is reacted with magnesium in a suitable solvent to form an intermediate, which is then polymerized in the presence of a suitable catalyst. It was surprisingly found that, by chosing appropriate reagents and reaction conditions, it is possible to obtain polymers, in particular poly-(3-substituted) thiophenes, with high regioregularity, high molecular weight and high purity in good yields and avoiding large amounts of hazardous by-products that need to be eliminated.

The polymers prepared by the process according to the present invention are especially useful as charge transport materials for semiconductor or light-emitting materials, components or devices. The above described routes of preparing polymers usually give a polymer that is terminated by reactive groups such as halogens, organometallic species such as boronate esters or trialkyl tins, or very reactive groups such as organo-magnesium or organo-zincs, which will be quenched under standard work up procedures. However, these groups have a disadvantageous effect on the electrical properties of the polymer; for example in semiconducting applications they can trap charges and thus reduce the charge carrier mobility of the polymer. It is therefore a further aim of this invention to further improve the electrical properties of the polymers obtained by the inventive process and also by the prior art methods as described above. The inventors have found that this aim can be achieved by chemical modification ('endcapping') of the polymers as described above and below. Thus, replacing the end groups of the polymers for example with alkyl groups or hydrogen can give poly(3-alkylthiophenes) with improved electrical properties. Another aspect of the invention therefore relates to a process of endcapping polymers, in particular regioregular poly (3-alkyl thiophenes) and to polymers obtained by this process.

SUMMARY OF THE INVENTION

The invention relates to a process of preparing a polymer by providing a thiophene having at least two groups that are capable of reacting with magnesium, reacting said thiophene with magnesium to form a regiochemical Grignard intermediate or a mixture of regiochemical Grignard intermediates, and polymerising said Grignard intermediate by adding a suitable catalyst.

The invention further relates to a process as described above and below, wherein the thiophene is a 3-substituted soluble thiophene having groups that are capable of reacting with magnesium in 2- and 5-position.

The invention further relates to a process as described above and below, wherein the polymer is a regioregular head-to-tail (HT) polymer having a regioregularity of ≧90%, preferably ≧95%, very preferably ≧98%.

The invention further relates to a process as described above and below, by
a) dissolving a thiophene having two groups that are capable of reacting with magnesium in a solvent or a mixture of solvents,
b) adding magnesium in an at least molar amount of the thiophene to the solution, or adding the solution to said magnesium, wherein said magnesium reacts with the thiophene to form a regiochemical Grignard intermediate or a mixture of regiochemical Grignard intermediates,
c) optionally removing the unreacted magnesium from the reaction mixture,
d) adding a catalyst to the reaction mixture, or adding the reaction mixture to a catalyst, and optionally agitating the resulting mixture, to form a polymer, and
e) recovering the polymer from the mixture.

The invention further relates to novel polymers, in particular novel poly-3-substituted thiophenes, obtainable or obtained by a process as described above and below.

The invention further relates to polymers, in particular poly-3-substituted thiophenes, preferably with high regioregularity preferably obtained from the process as described above and below, wherein one or more of the terminal groups are chemically modified ('endcapped'), especially for use a semiconductors. The invention further relates to a process of chemically modifying the terminal group of a polymer, in particular of a poly-3-substituted thiophene, during or after polymerisation ('endcapping').

The invention further relates to a semiconductor or charge transport material, component or device comprising one or more polymers as described above and below.

The invention further relates to the use of polymers according to the invention as semiconductors or charge transport materials, in particular in optical, electrooptical or electronic devices, like for example in field effect transistors (FET) as components of integrated circuitry, as thin film transistors in flat panel display applications or for Radio Frequency Identification (RFID) tags, or in semiconducting components for organic light emitting diode (OLED) applications such as electroluminescent displays or backlights of e.g. liquid crystal displays (LCD), for photovoltaic or sensor devices, as electrode materials in batteries, as photoconductors and for electrophotographic applications like electrophotographic recording.

The invention further relates to the use of the polymers according to the present invention as electroluminescent materials, in photovoltaic or sensor devices, as electrode materials in batteries, as photoconductors, for electrophotographic applications or electrophotographic recording or for detecting and discriminating DNA sequences.

The invention further relates to an optical, electrooptical or electronic device, FET, integrated circuit (IC), TFT or OLED comprising a semiconducting or charge transport material, component or device according to the invention.

The invention further relates to a TFT or TFT array for flat panel displays, radio frequency identification (RFID) tag, electroluminescent display or backlight comprising a semiconducting or charge transport material, component or device or a FET, IC, TFT or OLED according to the invention.

The invention further relates to a security marking or device comprising a FET or an RFID tag according to the invention.

DETAILED DESCRIPTION OF THE INVENTION

Figure 1:
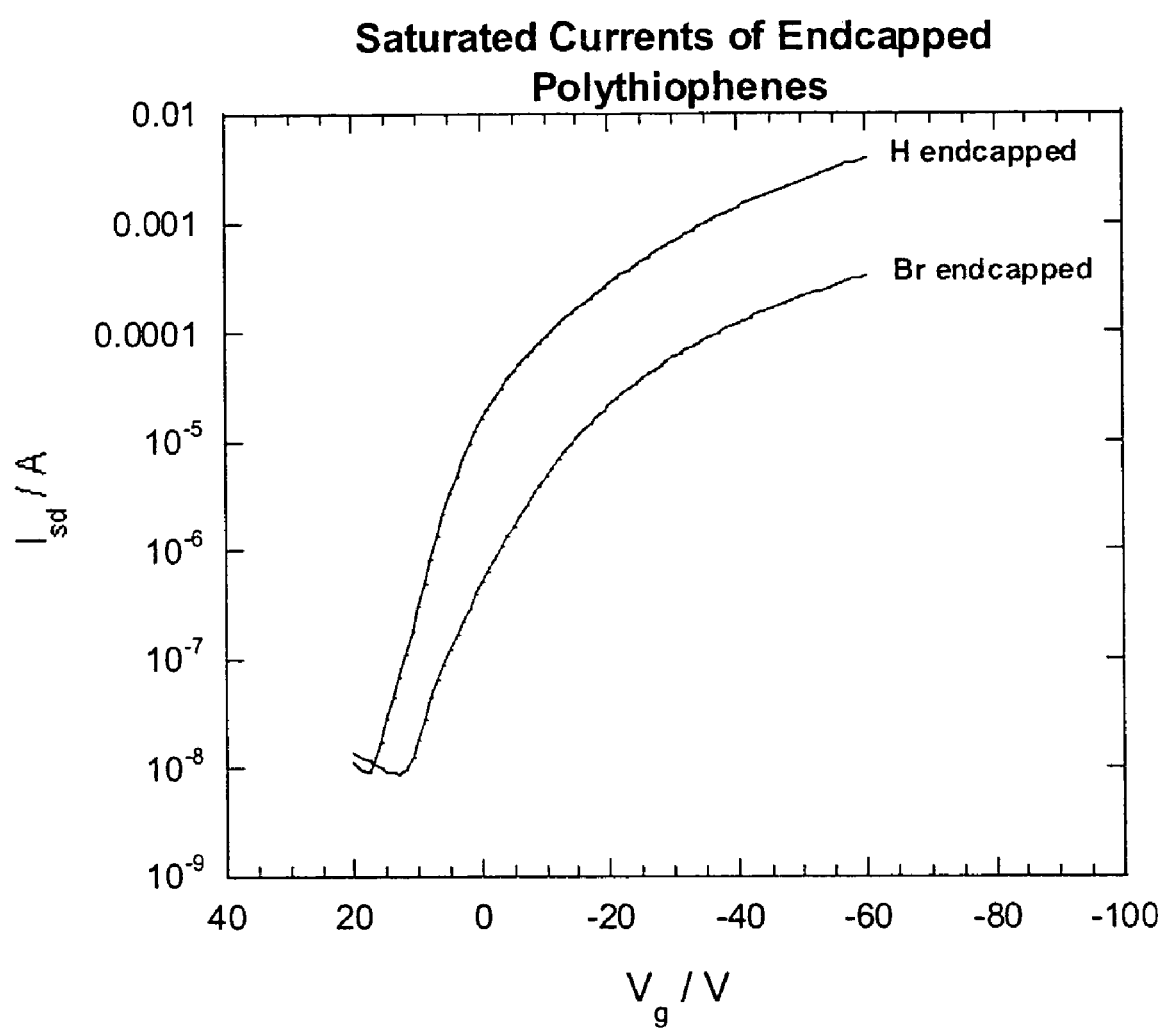
FIG. 1 shows forward transfer characteristics for polymers With different endgroups according to example 1 and 2 of the present invention.

The polymers prepared by the process according to the present invention are preferably selected of formula I

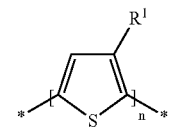

wherein n is an integer>1 and $R^1$ is a group that does not react with magnesium under the conditions as described for the process according to the present invention above and below. Preferably $R^1$ is an organic group which when it is unsubstituted and unmodified straight chained or branched alkyl has 5 or more C-atoms. Very preferably $R^1$ is an organic group having 5 or more C-atoms.

The thiophene used as educt in the process according to the present invention is preferably selected of formula II

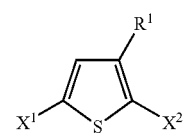

wherein $R^1$ has the meaning given in formula I and $X^1$ and $X^2$ are independently of each other a group that is capable of reacting with magnesium. Especially preferably $X^1$ and $X^2$ are Cl and/or Br, most preferably Br.

The process according to the present invention offers significant advantages over the methods disclosed in prior art especially regarding economical and ecological aspects, whilst providing polythiophenes in comparable or even better yield and quality.

With the process according to the present invention it is possible to prepare polythiophenes, in particular HT-poly-(3-substituted) thiophenes with a regioregularity of 90% or higher in a yield of 50% or higher (related to the thiophene educt). As mentioned above, these highly regioregular HT-poly-(3-substituted) thiophenes are particularly suitable for use as charge-transport or semiconductor material in electronic or optical devices.

The regioregular polymers of the present invention thus have a high number, and do preferably exclusively consist, of HT-linked repeating units as shown in formula Ia

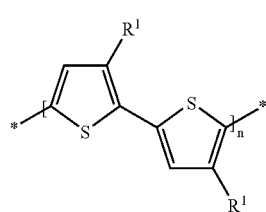

Furthermore, the costly and difficult preparation of Grignard reagents like organomagnesium halides is not necessary, instead magnesium can be used as reagent. Also, the emission of large amounts of hazardous by-products like methyl bromide can be avoided.

The general method of adding magnesium instead of Grignard reagents like organomagnesium halides has been described in prior art for the preparation of polythiophenes and poly-3-alkylthiophenes. However, magnesium is generally not considered to be highly regioselective in conventional Grignard reactions. This is supported by the teaching of the prior art documents mentioned above, which do not report polymers with high regioregularity.

The inventors of the present invention have found that polythiophenes with high regioregularity, high molecular weight and good processability can be obtained by appropriate selection of the reaction conditions and the reagents, like the use of linear ethers as solvents and of thiophene monomers with bromo or chloro groups in 2/5-position as educts. Also, the use of 3-substituted thiophenes with organic substituents in 3-position that preferably have 5, 6 or more C-atoms improves the processability and solubility of the polythiophene. As a result, during polymerisation the growing polymer remains longer in solution and a high molecular weight and good regioregularity can be obtained.

After polymerisation the polymer is preferably recovered from the reaction mixture, for example by conventional work-up, and purified. This can be achieved according to standard methods known to the expert and described in the literature.

As a result of the process according to the present invention, the obtained polythiophenes are usually terminated by the leaving groups that are capable of reacting with magnesium in 2 and 5-position of the thiophene monomer, or derivatives thereof. In case thiophene educts of formula II are used, the obtained polymers correspond to formula I1

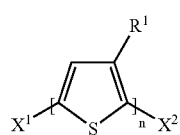

I1 wherein n, $R^1$, $X^1$ and $X^2$ have the meanings given in formula I and II.

Another object of the present invention is a process of chemically modifying the reactive terminal groups of a polymer, in particular a poly-3-substituted thiophene, during or after polymerisation. This process is hereinafter also referred to as 'endcapping'. Another object of the invention is a polymer, in particular a poly-3-substituted thiophene, wherein the terminal groups are chemically modified to replace monomer end groups, hereinafter also referred to as 'endcapped polymer'. Another object of the invention is the use of an endcapped polymer, in particular an endcapped poly-3-substituted thiophene, as semiconductor or charge transport material, in particular for the uses and devices as described above and below.

Endcapping of polyalkylthiophene is known in the art and is described for example by B. M. W. Langeveld-Voss, R. A. J. Janssen et al., Chem Commun 2000 81-82, and J. Liu., R. S. Loewe and R. D. McCullough, Macromolecules, 1999, 32 5777-5785, as an aid for understanding the reaction mechanism (Liu, Janssen) or to enable a later reaction of the polymer or to encourage binding to a substrate (Janssen). Furthermore, U.S. Pat. No. 6,602,974 describes the chemical modification of polyalkylthiophenes by replacing the terminal halogen groups with H or functional end groups for the preparation of block copolymers.

The inventors of the present invention have found that endcapping can also be used as a suitable method to provide a polymer with improved electrical properties. For example, by removing bromine end groups from the polymer chains, a source of charge carrier trapping is eliminated and higher charge carrier mobilities can be observed. The main benefit concerns the improvement in transistor performance stability. The carbon-bromine bond is susceptible to undergo further reaction in the presence of charged species, which are present during transistor operation. These suspected chemical reactions both change the properties of the semiconducting polymer, as well as release mobile ions, which lead to transistor hysteresis and threshold voltage drifts. Endcapping reduces the reactivity of the charged polymer and hence improves stability.

Thus, another aspect of the invention relates to a method of improving the electrical properties, like the charge carrier mobility, and the processability, of a polymer, in particular of a polyalkylthiophene, by chemically modifying the endgroups of the polymer (endcapping) as described above and below. Another aspect of the invention relates to endcapped polymers and their use as semiconductors, for example in the applications as described above and below.

The process of endcapping by conversion of, for example, residual halogen end groups into other groups or reactive species is not limited to polymers obtained by the method of the present invention. It can also be carried out with other polymers, for example those obtained by the methods of Rieke, McCullough, Suzuki or Stille as described above.

Endcapping can be carried out before or after recovering the polymer from the polymerisation reaction mixture, before or after work-up of the polymer or before or after its purification, depending on which is more suitable and more effective regarding the material costs, time and reaction conditions involved. For example, in case expensive co-reactants are used for endcapping it may be more economical to carry out the endcapping after purification of the polymer. In case the purification effort is economically more important than the co-reactants it may be preferred to carry out the endcapping before purification or even before recovering the polymer from the polymerisation reaction mixture.

Especially preferred are endcapped poly-3-substituted thiophenes obtained by a Grignard reaction with magnesium according to the inventive process as described above and below, wherein the reactive terminal groups of the polymer are chemically modified during or after polymerisation, or after recovering the polymer from the mixture, or after purification of the polymer.

As a result of the process according to the present invention, at the end of the polymerisation step the end groups $X^1$ and $X^2$ are either a halogen or Grignard group. At this stage, an aliphatic Grignard reagent RMgX or dialkyl Grignard reagent $MgR_2$, wherein X is halogen and R is an aliphatic group, or active Magnesium is preferably added to convert the remaining halogen end groups to Grignard groups. Subsequently, for example to give an alkyl end group an excess of an ω-haloalkane is added which will couple to the Grignard. Alternatively, to give a proton end group the polymerisation is quenched into a non-solvent such as an alcohol.

To provide reactive functional end groups, like for example hydroxyl or amine groups or protected versions thereof, the halogen end groups are for example reacted with a Grignard reagent R'MgX, wherein R' is such a reactive functional group or protected reactive functional group.

Instead of a Grignard reagent it is also possible to carry out endcapping using an organo lithium reagent, followed by addition of an ω-haloalkane.

It is also possible to replace H end groups by reactive functional groups by using e.g. the methods described in U.S. Pat. No. 6,602,974, such as a Vilsmeier reaction to introduce aldehyde groups followed by reduction with metal hydrides to form hydroxyl groups.

If the polymer has been fully worked up prior to endcapping, it is preferred to dissolve the polymer in a good solvent for Grignard coupling such as diethyl ether or THF. The solution is then treated for example with the above mentioned organo Grignard reagent RMgX or MgR$_2$ or R'MgX or with a zinc reagent, RZnX, R'ZnX or ZnR$_2$, where R and R' are as defined above. A suitable nickel or palladium catalyst is then added along with the haloalkane.

This method of endcapping is also effective for example for polymers prepared by the McCullough or Rieke route.

In the case of polymers prepared by the Suzuki or Stille route, these are preferably endcapped as follows: For the Suzuki reaction at the end of the polymerisation alkyl termination is preferably obtained by addition of a 2-boronic-5-alkyl thiophene to react with the bromine end groups, followed by an excess of a 2-bromo-5-alkyl thiophene to react with the boronic end groups. To obtain a hydrogen endcapped species, reaction with 2-boronic thiophene followed by an excess of 2-bromo thiophene is required. A similar process can be employed for the Stille route, but using a 2-trialkyl stannyl reagent, for example 2-trialkyl stannyl-5-alkyl thiophene, instead of boronic thiophene. Similarly, if the endcapping is carried out after initial quenching and purification of the polymer, it is preferred to dissolve the polymer and add a suitable catalyst.

Very preferred are endcapped polymers wherein the terminal groups during or after polymerisation are replaced by H or an alkyl group (hereinafter also referred to as 'polymers endcapped by H or an alkyl group').

Preferably endcapping is carried out before purification of the polymer. Further preferably endcapping is carried out after step d) of the process as described above and below. In another preferred embodiment of the present invention the endcapper is added during polymerisation to remove the end groups and possibly control the molecular weight of the polymer.

Preferably, substantially all molecules in a polymer sample are endcapped in accordance with this invention, but at least 80%, preferably at least 90%, most preferably at least 98% are endcapped.

By chemical modification of the terminal groups (endcapping) of the polymers according to the present-invention, it is possible to prepare novel polymers with different terminal groups. These polymers are preferably selected of formula I2

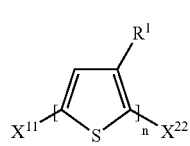

I2 wherein n and R$^1$ have the meanings given in formula I and II, and X$^{11}$ and X$^{22}$ are independently of each other H, halogen, stannate, boronate or an aliphatic, cycloaliphatic or aromatic group that may also comprise one or more hetero atoms.

Especially preferably X$^{11}$ and X$^{22}$ are selected from H or straight-chain or branched alkyl with 1 to 20, preferably 1 to 12, very preferably 1 to 6 C-atoms, most preferably straight-chain alkyl or branched alkyl like isopropyl or tert.butyl. Aromatic groups X$^{11}$ and X$^{22}$ tend to be bulky and are less preferred.

As described above, the end groups X$^{11}$ and X$^{22}$ are preferably introduced by reacting the polymer of formula I1 with a Grignard reagent MgRX, MgR$_2$ or MgR'X as described above, wherein R and R' are X$^{11}$ or X$^{22}$ as defined in formula I2.

By introducing suitable functional end groups X$^{11}$ and/or X$^{22}$ it is possible to prepare block copolymers from the polymers according to the present invention. For example, if one or both of the end groups X$^{11}$ and X$^{22}$ in a polymer of formula I2 is a reactive group or a protected reactive group, like for example an optionally protected hydroxy or amine group, they can be reacted (after removing the protective group) with the end group of another polymer of formula I2 (e.g. with different groups R$^1$ and/or X$^{11}$ and/or X$^{22}$), or with a polymer of different structure. If one of X$^{11}$ and X$^{22}$ is a reactive group, diblock copolymers can be formed. If both X$^{11}$ and X$^{22}$ are reactive groups, a triblock copolymer can be formed.

Alternatively a block copolymer can be formed by introducing reactive or protected reactive groups X$^{11}$ and/or X$^{22}$, adding a catalyst and one or monomers, and initiating a new polymerization reaction starting from the site of the groups X$^{11}$ and/or X$^{22}$.

Suitable functional end groups and methods of their introduction can be taken from the above disclosure and from prior art. Details how to prepare block copolymers can be taken e.g. from U.S. Pat. No. 6,602,974, the entire disclosure of which is incorporated into this application by reference.

The process according to the present invention is exemplarily illustrated in Scheme 1 below, wherein n, R$^1$, X$^1$ and X$^2$ have the meaning of formula I and II.

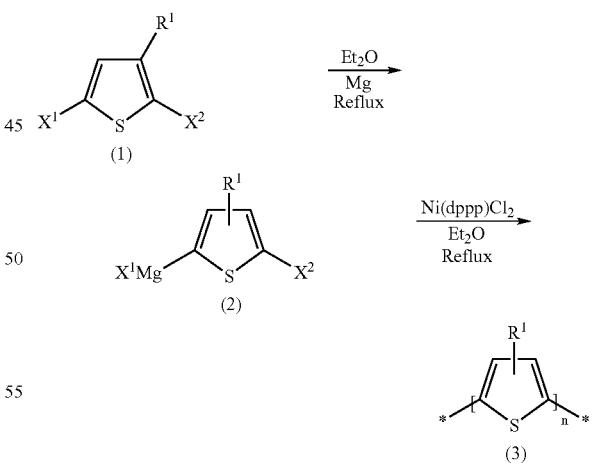

If R$^1$ is a group that is reactive with magnesium under the process conditions as described above and below, it is preferably transformed into, or coupled with, a protective group, in order not to take part in the reactions forming (2) and (3). Suitable protective groups are known to the expert and described in the literature, for example in Greene and Greene, "Protective Groups in Organic Synthesis", John Wiley and Sons, New York (1981).

The starting materials and reagents used in the process according to the present invention are either commercially available (e.g. from Aldrich) or can be easily synthesized by methods well known to those skilled in the art.

In some cases it may be suitable to further purify the thiophene monomer and the other reagents before using them in the inventive process. Purification can be carried out by standard methods known to the expert and described in the literature.

The process according to the present invention as exemplarily depicted in Scheme 1 is preferably carried out as follows:

In a first step (step a)) a 3-substituted thiophene (1), preferably 3-substituted 2,5-dihalothiophene, most preferably 3-substituted 2,5-dibromothiophene, like for example 2,5-dibromo-3-alkylthiophene, which is a readily available starting material, is dissolved in a solvent or a solvent mixture, like for example diethyl ether.

The solvent or solvent mixture preferably consists of one or more polar aprotic solvents, which can be any solvent of this type, like for example dialkylethers such as diethyl ether, di-n-butyl ether, di-n-propyl ether, di-isopropyl ether, glycol ethers such as 1,2-dimethoxyethane, ethers with two different alkyl groups such as tert.-butylmethyl ether, or mixtures thereof, or mixtures of aromatic or aliphatic solvents such as mixtures of toluene with the above ethers.

Preferably the solvent is selected from linear ethers like diethyl ether, di-n-butyl ether, di-n-propyl ether, di-isopropyl ether, ethers with two different alkyl groups, 1,2-dimethyoxyetane or tert.-butylmethyl ether or mixtures thereof, or a mixture of toluene with one or more of these ethers.

Especially preferably the solvent is diethyl ether.

The concentration of the thiophene educt (1) in the solvent is preferably from 40 to 200 g/l, very preferably from 80 to 130 g/l.

In a second step (step b)) magnesium is added to the reaction mixture in an at least molar amount of the thiophene educt (1), preferably in an excessive amount from more than 1 to 3, preferably from 1.01 to 2.00, very preferably from 1.02 to 1.50, most preferably from 1.02 to 1.20 times the molar amount of the thiophene educt.

The Grignard reaction is then started for example by heating the reaction mixture to reflux or by adding a suitable starting agent such as $Br_2$, $I_2$, DIBAH (diisobutylaluminium hydride) or others, or by other methods of activating the magnesium surface. The Grignard reaction is then allowed to proceed, optionally under agitating and/or heating the reaction mixture, for a sufficient period of time to give the intermediate (2).

In an optional next step (step c)), the non-reacted magnesium is then removed from the reaction mixture e.g. by filtration. Preferably the magnesium is removed.

In the next step (step d)), a suitable catalyst is added to the reaction mixture in an effective amount to initiate the polymerisation via a Grignard metathesis reaction. Usually the catalyst is reactive enough to start the polymerisation without other means, however in practice the mixture is typically stirred while adding the catalyst.

Alternatively, it is possible to add the reaction mixture to the catalyst.

The catalyst in step d) can be any catalyst that is suitable for a reaction involving organometallic reagents, including for example Ni, Pd or other transition metal catalysts. Preferably it is selected from nickel catalysts, in particular Ni(II) catalysts like Ni(dppp)$Cl_2$ (1,3-diphenylphosphinopropane nickel(II) chloride) or Ni(dppe)$Cl_2$ (1,2-bis(diphenylphosphino)ethane nickel(II) chloride), furthermore e.g. copper catalysts like CuI, CuBr or $Li_2CuCl_4$ or Pd catalysts like Pd(PPh$_3$), PdCl$_2$(dppe).

The catalyst is preferably added in an amount from 0.1 to 5%, preferably 0.5 to 2 mol % of the thiophene educt.

The polymerisation (Grignard metathesis) reaction is then allowed to proceed, optionally under agitating and/or heating the reaction mixture, for a sufficient period of time to give the polymer (3).

The process according to the present invention may be run at any temperature providing a sufficient conversion rate. It is preferred that the reaction is performed at a temperature between –5° C. and the solvent's reflux temperature, in particular at the temperatures as specified above and below. The term "reflux temperature" includes temperatures at or slightly below the boiling point of the solvent.

The selection of a suitable reaction time depends on the actual rate of the individual reaction. Preferably the reaction times are as given above and below.

For the reaction of the thiophene educt with magnesium (step b)) the reaction temperature is preferably in the range from 10° C. to reflux temperature, most preferably from room temperature to reflux temperature. The reaction time is from 15 min to 24 h, preferably from 30 min to 6 h.

For the polymerisation reaction (step d)) the temperature is preferably in the range from –5° C. to reflux temperature, most preferably from room temperature to reflux temperature. The reaction time is from 15 min to 48 h, preferably from 45 min to 4 h.

The reactions according to steps b) and d) are optionally carried out under agitating the reaction mixture, which can be achieved by known methods.

Steps a) to d), in particular steps b) and d) are preferably carried out under a dry and inert atmosphere, e.g. under nitrogen.

The reaction products (2) and (3) prepared by the process according to the present invention may be isolated by usual work-up and purification with standard procedures well known to those skilled in the art.

The intermediate (2) obtained in step b) is directly used in step d). However, for the purpose of e.g. investigating the proceeding of the reaction process or analysing the ratio of the regiochemical intermediates produced it may be suitable to quench the reaction mixture.

In the last step (step e)) the polymer (3) is recovered from the reaction mixture. Preferably the polymer is recovered from the mixture by quenching the reaction mixture with an alcoholic or aqueous solution or/and precipitating the polymer.

The polymer can then be purified by known methods to remove inorganic impurities as well as monomers and short-chain oligomers, or may also be used without further purification. Preferably the polymer is purified. Suitable and preferred purification methods include solid-phase extraction, liquid-liquid extraction, precipitation, adsorption and filtration. Preferably a combination of purification methods is selected to obtain a high-purity product best suitable for application, For example a preferred purification method includes aqueous quenching, for example with a mixture of chloroform/water, optional liquid/liquid extraction or distilling off the original solvent, precipitation into a polar solvent like for example methanol, and washing with an unpolar solvent like for example heptane.

Suitable reagents and process conditions for the steps d) and e) including the reaction of the intermediate (2) to the polymer (3), can also be taken from McCullough et al., *Adv.*

*Mater.*, 1999, 11(3), 250-253, EP 1 028 136 and U.S. Pat. No. 6,166,172, the entire disclosure of these documents being incorporated into this application by reference.

An especially preferred embodiment relates to a process including the following steps a) dissolving a thiophene having two groups that are capable of reacting with magnesium, preferably a thiophene of formula II, very preferably in an amount of from 40 to 200 g/l, in diethyl ether, b) adding magnesium in 1.02 to 1.20 times the molar amount of the thiophene, or adding the thiophene solution to the magnesium, and heating the mixture to reflux to form a regiochemical Grignard intermediate, c) removing the unreacted magnesium from the reaction mixture, d) adding a Ni(II) catalyst, preferably Ni(DPPP)Cl$_2$ or Ni(DPPE)Cl$_2$ to the reaction mixture, or adding the reaction mixture to the Ni(II) catalyst, and agitating the resulting mixture, preferably under reflux, to form a polymer, and e) recovering the polymer from the mixture.

The intermediate (2) is usually obtained as a mixture of regiochemical isomers (2a) and (2b), and may also include a, typically small, amount of the double-Grignard product (2c), as shown below, wherein $X^1$, $X^2$ and $R^1$ have the meanings of formula I and I1

(2a)
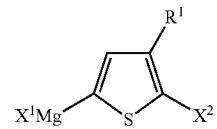

(2b)
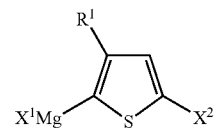

(2c)
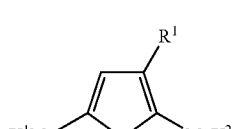

The ratio of these intermediates is depending for example on the molar excess of Magnesium, the solvent, temperature and reaction time.

For example, if the reaction is carried out according to the especially preferred embodiment described above, the intermediates 2a, 2b and 2c can be obtained in a ratio of 85/5/10.

Depending on the processing conditions, like for example the solvent and the amount of magnesium, the ratio of isomer intermediates 2a/2b/2c can be varied. A preferred process includes isomer intermediate ratios 2a/2b/2c of 80-90/2-20/0-20.

The polymers according to the present invention are especially preferably regioregular HT-poly-(3-substituted) thiophenes. The regioregularity (=head-to-tail couplings divided by the total couplings, and expressed as a percentage), in these polymers is preferably at least 85%, in particular 90% or more, very preferably 95% or more, most preferably from 98 to 100%.

Polymers of formula I, I1 and I2 having a high percentage of HT-couplings accordingly have a corresponding high number of HT dyads or HT-HT-triads formula Ia/b, I1a/b and I2a/b shown below.

Ia
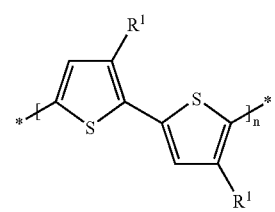

I1a
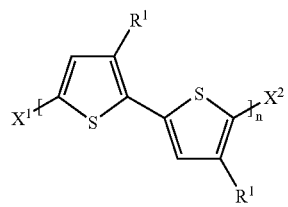

I2a
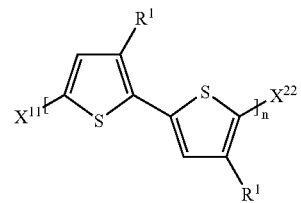

Ib
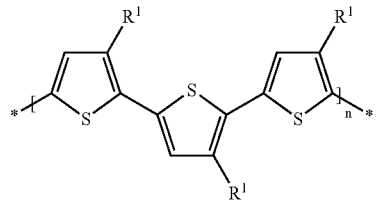

I1b
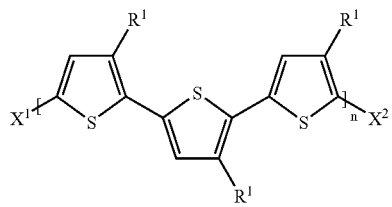

I2b
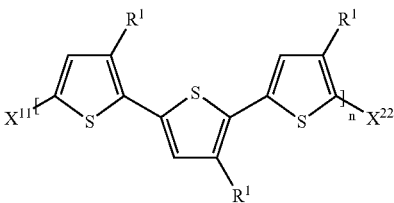

wherein $R^1$, $X^1$, $X^2$, $X^{11}$, $X^{22}$ have the meanings given above.

Regioregular poly-(3-substituted) thiophenes are advantageous as they show strong interchain pi-pi-stacking interactions and a high degree of crystallinity, making them effective charge transport materials with high carrier mobilities, as described for example in U.S. Pat. No. 6,166,172.

The polymers according to the present invention preferably have a degree of polymerisation (or number n of recurring units) from 2 to 5,000, in particular from 10 to 5,000 or from 110 to 5,000, very preferably from 50 to 1,000, most preferably from above 100 to 1,000.

Further preferred are polymers having a molecular weight from 5,000 to 300,000, in particular from 10,000 to 100,000, preferably from 15,000 to 100,000, very preferably from 20,000 to 100,000.

$R^1$ in formula I, I1 and II is preferably an organic group, preferably a non-reactive or protected reactive organic group, which has preferably 5 or more C-atoms.

Especially preferably $R^1$ is straight chain, branched or cyclic alkyl with 1 or more, preferably 5 or more, very preferably 1 to 20 C-atoms, which may be unsubstituted, mono- or poly-substituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —$SO_2$—, —S—CO—, —CO—S—, —$CY^1$=$CY^2$— or —C≡C— in such a manner that O and/or S atoms are not linked directly to one another, optionally substituted aryl or heteroaryl preferably having 1 to 30 C-atoms, or P-Sp, with $R^0$ and $R^{00}$ being independently of each other H or alkyl with 1 to 12 C-atoms, $Y^1$ and $Y^2$ being independently of each other H, F, Cl or CN, P being a polymerisable or reactive group which is optionally protected, and Sp being a spacer group or a single bond.

$X^1$ and $X^2$ in formula I1 and II are preferably independently of each other selected from halogen, very preferably Cl or Br, most preferably Br.

$X^{11}$ and $X^{22}$ in formula I2 are preferably independently of each other selected from H, halogen, B(OR')(OR'') or $SnR^0R^{00}R^{000}$ or straight chain, branched or cyclic alkyl with 1 to 20 C-atoms, which may be unsubstituted, mono- or poly-substituted by F, Cl, Br, I, —CN and/or —OH, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —$CY^1$=$CY^2$— or —C≡C— in such a manner that O and/or S atoms are not linked directly to one another, optionally substituted aryl or heteroaryl, or P-Sp, with $R^0$, $R^{00}$, $Y^1$, $Y^2$, P and Sp having the meanings given above, $R^{000}$ being H or alkyl with 1 to 12 C-atoms, and R' and R'' being independently of each other H or alkyl with 1 to 12 C-atoms, or OR' and OR'' together with the boron atom may also form a cyclic group having 2 to 10 C atoms.

Especially preferred are polymers and compounds of formula I, II, I1 and I2 wherein $R^1$ is an organic group, preferably an alkyl group with 5 or more C-atoms, $R^1$ is a straight-chain alkyl group with 1 to 12, preferably 5 to 12 C-atoms, $R^1$ is n-hexyl, $R^1$ is selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, optionally substituted aryl or heteroaryl, or P-Sp-, in particular $C_1$-$C_{20}$-alkyl or $C_1$-$C_{20}$-fluoroalkyl, preferably straight-chain groups, $R^1$ is selected from alkyl that is optionally substituted with one or more fluorine atoms, alkenyl, alkynyl, alkoxy, thioalkyl or fluoroalkyl, all of which are straight-chain and have 1 to 12, preferably 5 to 12 C-atoms, $R^1$ is selected from pentyl., hexyl, heptyl, octyl, nonyl, decyl, undecyl or dodecyl, $X^1$ and $X^2$ have the same meaning, $X^1$ and $X^2$ denote Br, $X^{11}$ and $X^{22}$ have the same meaning, $X^{11}$ and $X^{22}$ denote H, $X^{11}$ and $X^{22}$ are selected from alkyl that is optionally substituted with one or more fluorine atoms, alkenyl, alkynyl, alkoxy, thioalkyl, silyl, ester, amino or fluoroalkyl, all of these groups being straight-chain or branched and having 1 to 20, preferably 1 to 12, most preferably 1 to 6 C atoms, or optionally substituted aryl or heteroaryl, or P-Sp as defined above, in particular straight-chain or branched $C_1$-$C_6$-alkyl, most preferably isopropyl, tert.butyl, or 2-methylbutyl, n is an integer from 2 to 5000, in particular 50 to 1000.

If in formula I, II, I1 and I2 $R^1$ is an alkyl or alkoxy radical, i.e. where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If in formula I, II, I1 and I2 $R^1$ is oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example. If in formula I, II and I1 $R^1$ is thioalkyl, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

If in formula I, II, I1 and I2 $R^1$ is fluoroalkyl, it is preferably straight-chain perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$.

Halogen is preferably F, Br or Cl.

—$CY^1$=$CY^2$— is preferably —CH=CH—, —CF=CF— or —CH=C(CN)—.

Aryl and heteroaryl preferably denote a mono-, bi- or tricyclic aromatic or heteroaromatic group with up to 25 C atoms that may also comprise condensed rings and is optionally substituted with one or more groups L, wherein L is halogen or an alkyl, alkoxy, alkylcarbonyl or alkoxycarbonyl group with 1 to 12 C atoms, wherein one or more H atoms may be replaced by F or Cl.

Especially preferred aryl and heteroaryl groups are phenyl in which, in addition, one or more CH groups may be replaced by N, naphthalene, thiophene, thienothiophene, dithienothiophene, alkyl fluorene and oxazole, all of which can be unsubstituted, mono- or polysubstituted with L as defined above.

Another preferred embodiment of the present invention relates to polythiophenes that are substituted in 3-position with a polymerisable or reactive group, which is optionally protected during the process of forming the polythiophene.

Particular preferred polymers of this type are those of formula I, I1 or I2 wherein $R^1$ denotes P-Sp. These polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

The polymerisable or reactive group P is preferably selected from

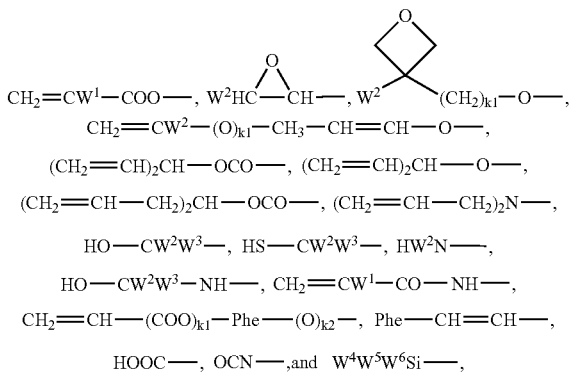

with $W^1$ being H, Cl, CN, phenyl or alkyl with 1 to 5 C-atoms, in particular H, Cl or $CH_3$, $W^2$ and $W^3$ being independently of each other H or alkyl with 1 to 5 C-atoms, in particular methyl, ethyl or n-propyl, $W^4$, $W^5$ and $W^6$ being independently of each other Cl, oxaalkyl or oxacarbonylalkyl with 1 to 5 C-atoms, Phe being 1,4-phenylene and $k_1$ and $k_2$ being independently of each other 0 or 1, or a protected derivative of these groups which is non-reactive with magnesium under the conditions described for the process according to the present invention. Suitable protective groups are known to the expert and described in the literature, for example in Greene and Greene, "Protective Groups in Organic Synthesis", John Wiley and Sons, New York (1981), like for example acetals or ketals.

Preferably, however, the polymerisable group is added to the inventive polymers as the last step, after polymerisation.

Especially preferred groups P are $CH_2$=CH—COO—, $CH_2$=C($CH_3$)—COO—, $CH_2$=CH—, $CH_2$=CH—O—, $(CH_2$=CH$)_2$CH—OCO—, $(CH_2$=CH$)_2$CH—O—,

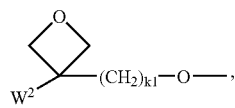

or protected derivatives thereof.

Polymerisation of group P can be carried out according to methods that are known the expert and described in the literature, for example in D. J. Broer; G. Challa; G. N. Mol, Macromol. Chem, 1991, 192, 59.

As spacer group Sp all groups can be used that are known for this purpose to the skilled in the art. The spacer group Sp is preferably of formula Sp'-X', such that P-Sp- is P-Sp'-X'-, wherein
Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X' is —O—, —S—, —CO—, —COO—, —OCO—, —O—COO—, —CO—$NR^0$—, —$NR^0$—CO—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^0$—, —$CY^1$=$CY^2$—, —C≡C—, —CH=CH—COO—, —OCO—CH=CH— or a single bond,
$R^0$ and $R^{00}$ are independently of each other H or alkyl with 1 to 12 C-atoms, and
$Y^1$ and $Y^2$ are independently of each other H, F, Cl or CN.
X' is preferably —O—, —S—, —$OCH_2$—, —$CH_2O$—, —$SCH_2$—, —$CH_2S$—, —$CF_2$—, —$OCF2$—, —$CF_2S$—, —$SCF_2$—, —$CH_2CH_2$—, —$CF_2CH_2$—, —$CH_2CF_2$—, —$CF_2CF_2$—, —CH=N—, —N=CH—, —N=N—, —CH=$CR^0$—, —$CY^1$=$CY^2$—, —C≡C— or a single bond, in particular —O—, —S—, —C≡C—, —$CY^1$=$CY^2$— or a single bond. In another preferred embodiment X' is a group that is able to form a conjugated system, such as —C≡C— or —$CY^1$=$CY^2$—, or a single bond. Typical groups Sp' are, for example, —$(CH_2)_p$—, —$(CH_2CH_2O)_q$—$CH_2CH_2$—, —$CH_2CH_2$—S—$CH_2CH_2$— or —$CH_2CH_2$—NH—$CH_2CH_2$— or —$(SiR^0R^{00}$—O$)_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

The polymers of the present invention are useful as optical, electronic and semiconductor materials, in particular as charge transport materials in field effect transistors (FETs), e.g., as components of integrated circuitry, ID tags or TFT applications. Alternatively, they may be used in organic light emitting diodes (OLEDs) in electroluminescent display applications or as backlight of, e.g., liquid crystal displays, as photovoltaics or sensor materials, for electrophotographic recording, and for other semiconductor applications.

The polymers according to the present invention show especially advantageous solubility properties which allow production processes using solutions of these compounds. Thus films, including layers and coatings, may be generated by low cost production techniques, e.g., spin coating. Suitable solvents or solvent mixtures comprise alkanes and/or aromatics, especially their fluorinated or chlorinated derivatives.

The polymers of the present invention are especially useful as charge transport materials in FETs. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the solubility properties of the compounds according to the invention and thus the processability of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with money value, like stamps, tickets, shares, cheques etc.

Alternatively, the polymers according to the invention may be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the polymers according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic *Metals*, 111-112, 2000, 31-34, Alcala, J. Appl. Phys., 88, 2000, 7124-7128 and the literature cited therein.

According to another use, the polymers according to the present invention, especially those which show photoluminescent properties, may be employed as materials of light sources, e.g., of display devices such as described in EP 0 889 350 A1 or by C. Weder et al., Science, 279, 1998, 835-837.

A further aspect of the invention relates to both the oxidised and reduced form of the polymers according to this invention. Either loss or gain of electrons results in formation of a highly delocalised ionic form, which is of high conductivity. This can occur on exposure to common dopants. Suitable dopants and methods of doping are known to those skilled in the art, e.g., from EP 0528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)(SbF_6^-)$, $(NO_2^+)$ $(SbCl_6^-)$, $(NO_2^+)(BF_4^-)$, $AgClO_4$, $H_2IrCl_6$, $La(NO_3)_3$ $6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the polymers of the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

According to another use the polymers according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

The examples below serve to illustrate the invention without limiting it. In the foregoing and the following, all temperatures are given in degrees Celsius, and all percentages are by weight, unless stated otherwise.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and, all parts and percentages are by weight, unless otherwise indicated.

EXAMPLE 1 a) Polymerisation:

9,7 g of 2,5-dibromo-3-hexylthiophene are dissolved in 100 ml diethylether. To 10% of this prepared solution 0,8 g magnesium are added and heated to reflux. The Grignard reaction is started by adding one drop of bromine. The rest (90%) of the prepared solution is added to the reaction mixture during 30 minutes and refluxed for further 2 hours. Then the excess magnesium is filtered off, the reaction cooled down to 0° C. and 0,2 g of Ni(dppp)$Cl_2$ are added to start the polymerisation, and the reaction heated to reflux.

b) Work-Up and Purification:

After 2 more hours of refluxing, 4 ml of isopropylmagnesium chloride (2 mol/l in diethyl ether) is added for H-endcapping.

After a reaction time of 2 hours the endcapping is finished and the reaction mixture is quenched with aqueous methanol. Extracting the product from the aqueous phase with chloroform and precipitating it into methanol gives the crude polymer which is further purified by Soxhlet extractions with methanol and heptane. Thus, 2.5 g (50%) of pure poly-3-hexylthiophene ($^1$H-NMR regioregularity>95%) are obtained. The molecular weight determined by GPC is $M_n$=12,600, $M_w$=21,700, the polydispersity is 1,7.

COMPARISON EXAMPLE 1

Diiodo Instead of Dibromo Monomer

Example 1 is repeated but with using 2,5-diiodo-3-hexylthiophene instead of 2,5-dibromo-3-hexylthiophene in the same molar amounts. However the mixture of Grignard intermediates precipitates and cannot be polymerised. Changing the concentration keeps the intermediate products in solution but after polymerisation an oily product is obtained which cannot be precipitated from methanol and is soluble in hot heptane, indicating a low molecular weight. Regioregularity is only around 70%.

COMPARISON EXAMPLE 2

THF Instead of Linear Ether as Solvent

Example 1 is repeated but with using THF instead of diethyl ether as solvent. As a result a low molecular weight product is obtained that is soluble in hot heptane and has a regioregularity only around 90%.

EXAMPLE 2

Endcapping (replacing Br by H)

Poly-3-hexylthiophene is prepared as described in example 1a). At the end of the polymerisation reaction a portion of the reaction mixture is end capped with H as described in example 1 b) and a portion is worked up without endcapping by immediate precipitation prior to the addition of the Grignard reagent. Analysis by MALDI-TOF mass spectroscopy (Matrix-Assisted Laser-Desorption/Ionization Time-Of-Flight, see M. Karas and F. Hillenkamp, Anal. Chem. 1988, 60, 2299 and J. Liu., R. S. Loewe and R. D. McCullough, Macromolecules, 1999, 32, 5777) indicate that the endcapped sample has predominantly H end groups, whereas the non-end-capped sample has a much higher amount of bromine end groups.

EXAMPLE 3

Endcapping (Replacing Br by Propyl)

Poly-3-hexylthiophene is prepared as described in example 1a). At the end of the polymerisation reaction a portion of the reaction mixture is end capped with an alkyl group by first adding isopropylmagnesium chloride (2 mol/L in diethylether) and after two hours adding 1-Bromopropane. The other portion is worked up with out endcapping. MALDI-TOF MS analysis indicates that the endcapped sample has predominantly propyl end groups where as the non-endcapped sample has a much higher amount of bromine end groups.

EXAMPLE 4

Use of Endcapped Polymer in a Transistor

Measurements of the maximum current versus voltage are carried out for Br-terminated and H-endcapped polymers of examples 1 and 2 using substrates and processing conditions as follows.

Thin-film organic field-effect transistors (OFETs) are fabricated on highly doped silicon substrates with a thermally grown silicon oxide ($SiO_2$) insulating layer, where the substrate served as a common gate electrode. Transistor source-drain gold electrodes are photolithographically defined on the $SiO_2$ layer. Prior to organic semiconductor deposition, FET substrates are treated with a silylating agent hexamethyldisilazane (HMDS). Thin semiconductor films are then deposited by spin-coating polymer solutions in chloroform on to the FET substrates. The electrical characterization of the transistor devices, is carried out in a dry nitrogen atmosphere using computer controlled Agilent 4155C Semiconductor Parameter Analyser.

The entire disclosures of all applications, patents and publications, cited herein and of corresponding European application No. 03017920.4, filed Aug. 6, 2003, and U.S. Provisional Application Ser. No. 60/493,451, filed Aug. 8, 2003, are incorporated by reference herein.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The results are shown in FIGS. 1-3. The effect of the end groups can be seen in the following ways:

As can be seen in FIG. 1, maximum current (and hence mobility) is higher for samples with H end capping with respect to Br end capping. Samples with H have a higher sub threshold slope.

Figure 2A:
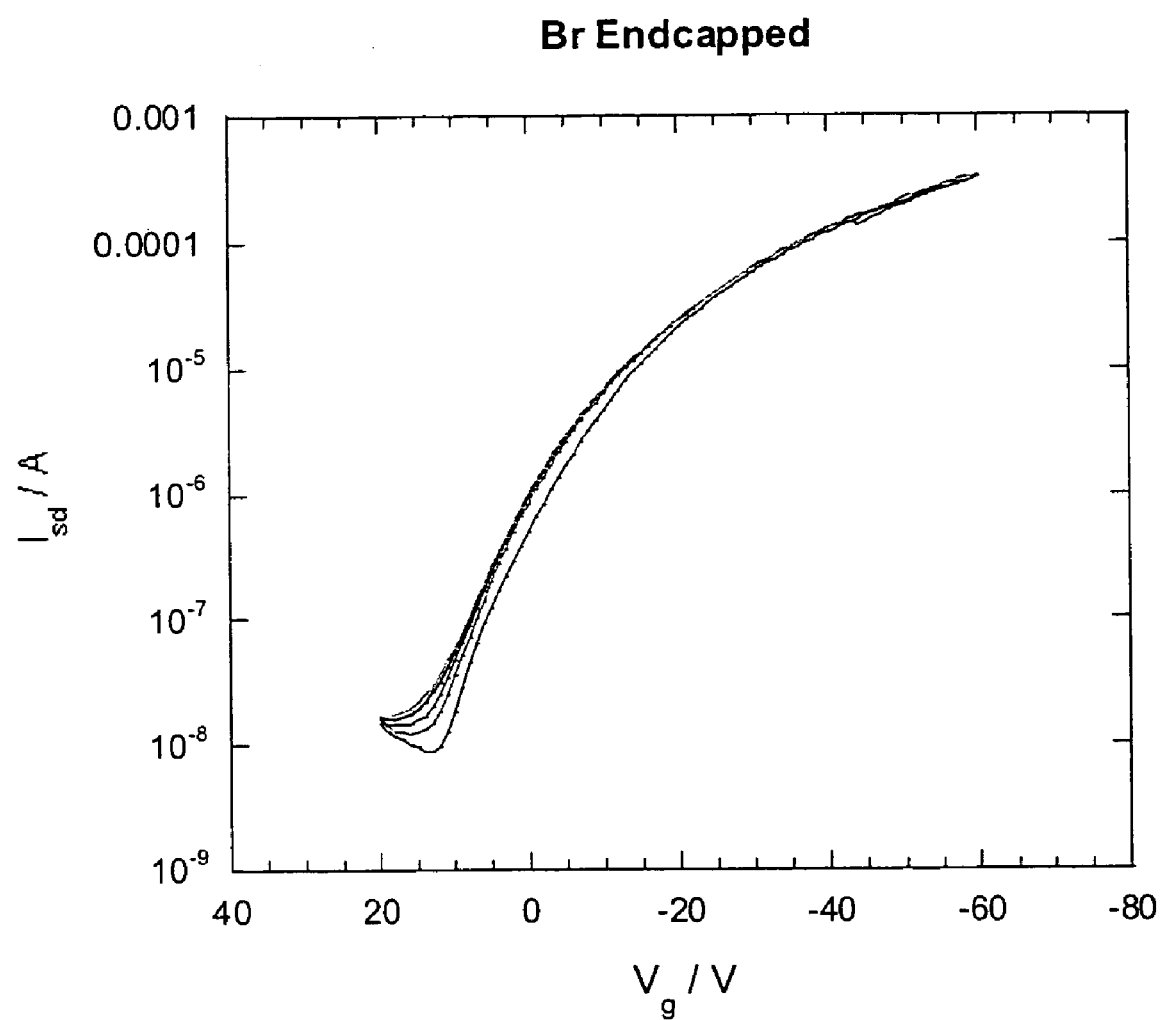
FIG. 2 shows repeated forward transfer scans for polymers with different endgroups according to example 1 and 2 of the present invention.
Figure 2B:
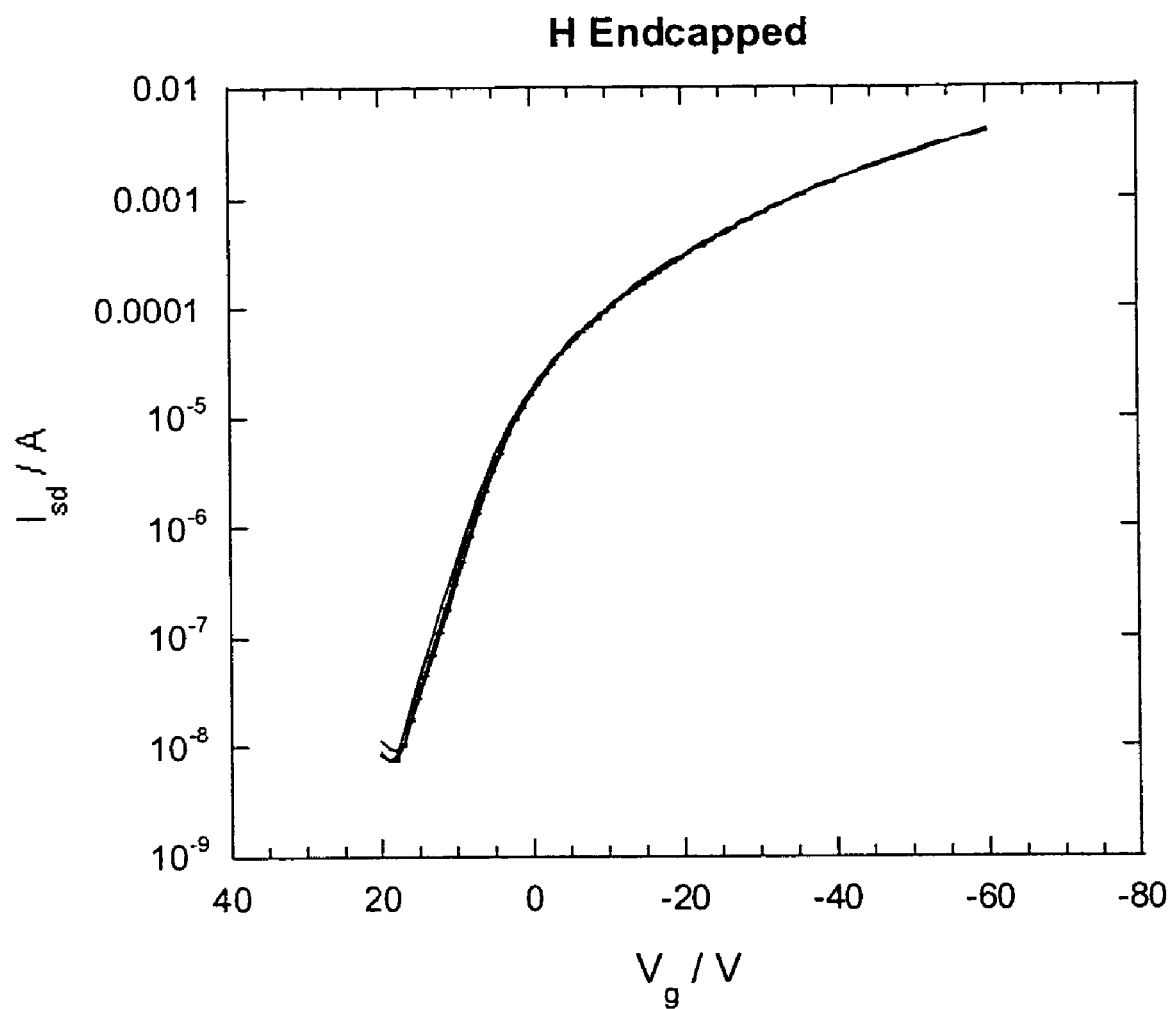

As can be seen in FIGS. 2A and 2B, stability of the samples to repeated scanning is superior for samples with H end caps (2B) than for those with bromine end caps (2A).

Figure 3A:
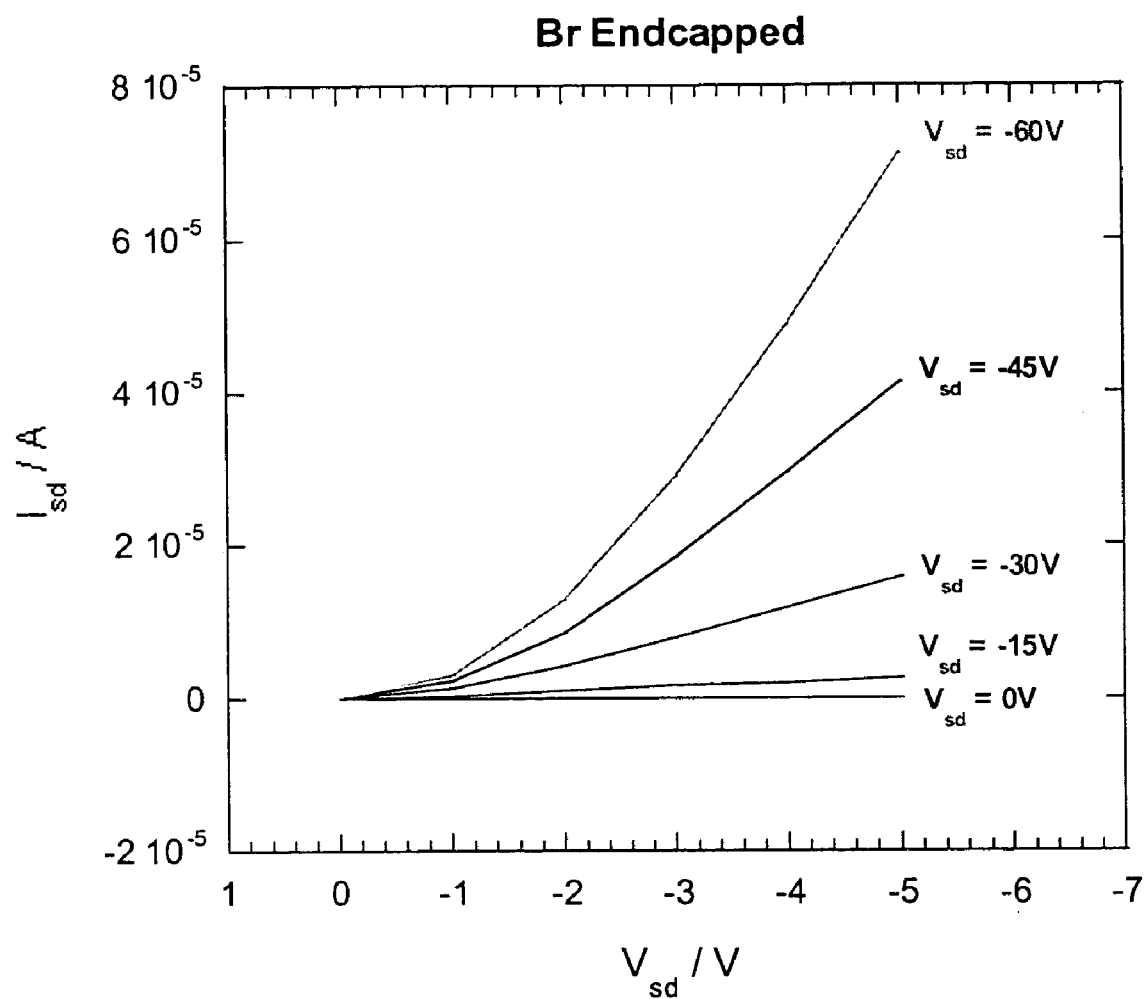
FIG. 3 shows transistor output characteristics at low $V_{sd}$ for polymers with different endgroups according to example 1 and 2 of the present invention.
Figure 3B:
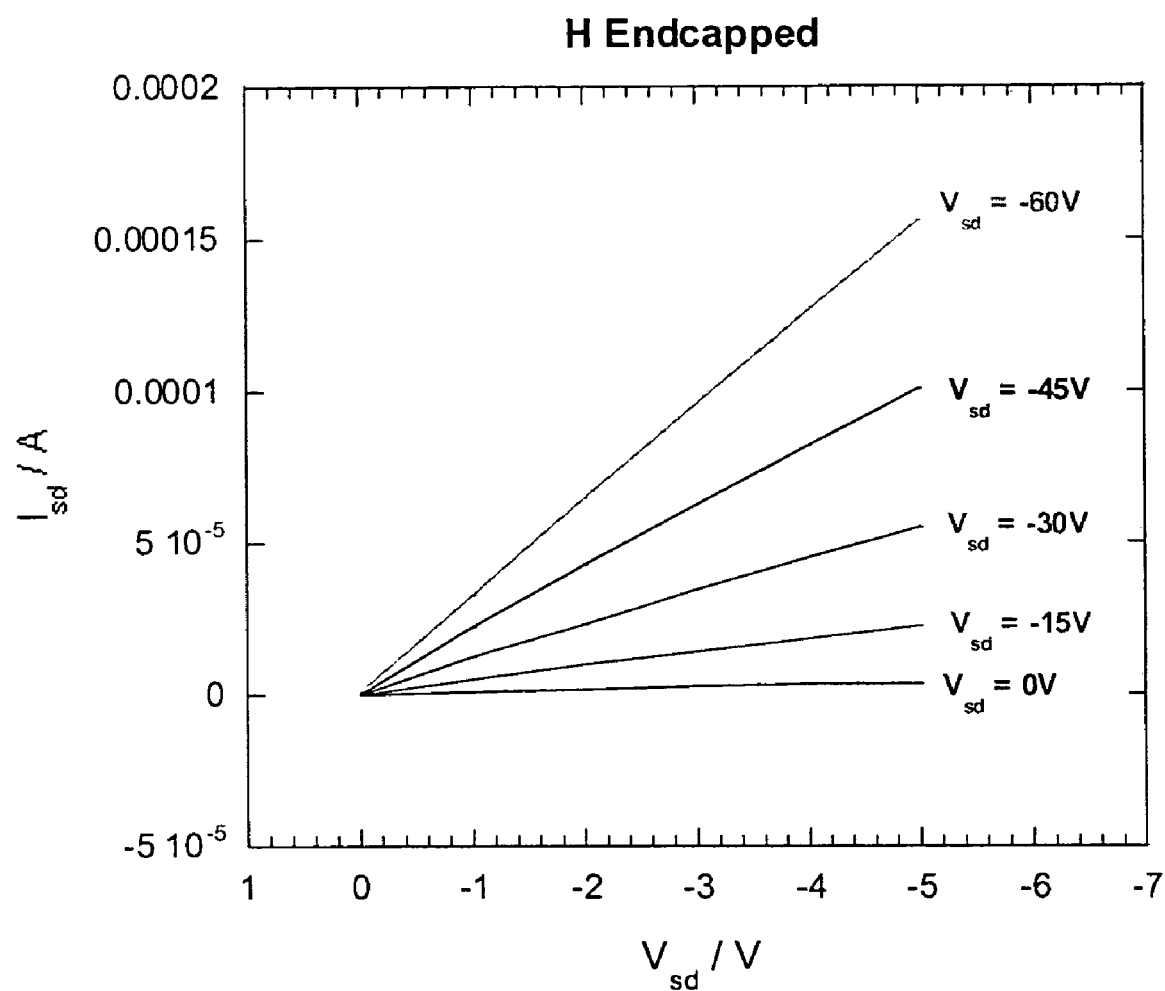

Finally, as can be seen in the transitor output scans FIGS. 3A and 3B, at low source-drain voltage H-capped samples (3B) show good ohmic contact behaviour. The sample with H capping shows perfect linear behaviour. The Br capped sample (3A) however displays significant contact resistance as can be seen by the non-linear behaviour of the current-voltage plot around 0V.

The invention claimed is:

1. A process for preparing a regioregular poly (3-substituted thiophene) having a regioregularity of≧95% head-to-tail (HT) couplings, comprising
providing a 3-substituted thiophene having chloro and/or bromo groups in 2-position and 5-position, wherein the substituent in 3-position is an organic group which when it is an unsubstituted and unmodified straight chained or branched alkyl has 5 or more C-atoms,
reacting said thiophene with magnesium in a solvent comprising a linear ether or a mixture of linear ethers to form a regiochemical Grignard intermediate or a mixture of regiochemical Grignard intermediates, and
polymerizing the Grignard intermediate by adding a suitable catalyst.

2. A process according to claim 1, comprising
a) dissolving the 3-substituted thiophene in a solvent or a mixture of solvents,
b) adding magnesium in an at least molar amount of the thiophene to the solution, or adding the solution to said magnesium, wherein said magnesium reacts with said thiophene to form a regiochemical Grignard intermediate or a mixture of regiochemical Grignard intermediates,
c) optionally removing the unreacted magnesium from the reaction mixture,
d) adding a catalyst to the reaction mixture, or adding the reaction mixture to a catalyst, and optionally agitating the mixture, to form a polymer, and
e) recovering the polymer from the mixture.

3. A process according to claim 1, wherein the 3-substituted thiophene is a 3-substituted 2,5-dibromo-thiophene.

4. A process according to claim 1, wherein the poly (3-substituted thiophene) has a regioregularity of $\geq 98\%$.

5. A process according to claim 1, wherein the solvent is diethyl ether, di-n-butyl ether, di-n-propyl ether, di-isopropyl ether, ethers with two different alkyl groups, 1,2-dimethyoxyethane or t-butylmethyl ether, or a mixture thereof, or a mixture of toluene with one or more of the above ethers.

6. A process according to claim 5, wherein the solvent is diethyl ether.

7. A process according to claim 2, wherein the concentration of the thiophene in the solution in step a) is from 40 to 200 grams per liter.

8. A process according to claim 1, wherein the amount of the magnesium is >1 to 3 times the molar amount of the thiophene.

9. A process according to claim 8, wherein the amount of the magnesium is 1.02 to 1.20 times the molar amount of the thiophene.

10. A process according to claim 1, wherein unreacted magnesium is removed before adding the catalyst.

11. A process according to claim 1, wherein the catalyst is a Ni(II) catalyst.

12. A process according to claim 11, wherein the catalyst is Ni(dppp)Cl$_2$(1,3-diphenylphosphinopropane nickel(II) chloride) or Ni(dppe)Cl$_2$(1,2-bis(diphenylphosphino)ethane nickel(II) chloride).

13. A process according to claim 1, wherein the formation of the regiochemical Grignard intermediate and the polymerization are carried out at room temperature to reflux temperature.

14. A process according to claim 13, wherein the formation of the regiochemical Grignard intermediate and the polymerization are carried out at reflux temperature.

15. A process according to claim 1, wherein the polymer is recovered from the reaction mixture and then purified.

16. A process according to claim 1, wherein one or more of the terminal groups of the polymer are chemically modified.

17. A process according to claim 1, wherein the polymer is of formula I

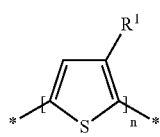

wherein
n is an integer>1, and
R$^1$ is a group that does not react with magnesium under the conditions of the process.

18. A process according to claim 1, wherein the 3-substituted thiophene is of formula II

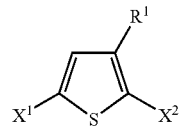

wherein
R$^1$ is a group that does not react with magnesium under the conditions of the process, and
X$^1$ and X$^2$ are, independently of each other, Br or Cl.

19. A process according to claim 17, wherein
R$^1$ is straight chain, branched or cyclic alkyl with 1 or more C-atoms, which is unsubstituted, mono- or polysubstituted by F, Cl, Br, I or CN, in which optionally one or more non-adjacent CH$_2$ groups are replaced, in each case independently from one another, by —O—, —S—, —NH—, —NR$^0$—, —SiR$^0$R$^{00}$—, —CO—, —COO—, —OCO—, —OCO—O—, —SO$_2$—, —S—CO—, —CO—S—, —CY$^1$=CY$^2$— or —C≡C— in such a manner that O and/or S atoms are not linked directly to one another, optionally substituted aryl or heteroaryl, or P-Sp, which when it is an unsubstituted and unmodified straight chained or branched alkyl has 5 or more C-atoms,
R$^0$ and R$^{00}$ are, independently of each other, H or alkyl with 1 to 12 C-atoms,
Y$^1$ and Y$^2$ are, independently of each other, H, F, Cl or CN,
P is a polymerizable or reactive group which is optionally protected, and
Sp is a spacer group or a single bond.

20. A process according to claim 19, wherein R$^1$ is C$_1$-C$_{20}$-alkyl that is optionally substituted with one or more fluorine atoms, C$_1$-C$_{20}$-alkenyl, C$_1$-C$_{20}$-alkynyl, C$_1$-C$_{20}$-alkoxy, C$_1$-C$_{20}$-thioalkyl, C$_1$-C$_{20}$-silyl, C$_1$-C$_{20}$-ester, C$_1$-C$_{20}$-amino, or C$_1$-C$_{20}$-fluoroalkyl.

21. A process according to claim 20, wherein R$^1$ is straight-chain or branched pentyl, hexyl, heptyl, octyl, nonyl, decyl, undecyl or dodecyl.

22. A process according to claim 21, wherein R$^1$ is n-hexyl.

23. A process according to claim 18, wherein X$^1$ and X$^2$ are Br.

24. A process according to claim 17, wherein n is an integer of 50 to 1,000.

25. A process according to claim 1, wherein the polymer is of formula I1

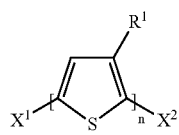

wherein
n is an integer>1, and
R¹ is a group that does not react with magnesium under the conditions of the process, and
X¹ and X² are, independently of each other, Br or Cl.

26. A process according to claim 16, wherein the polymer after chemical modification is of formula I2

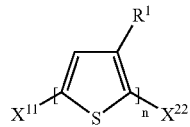

wherein
n is an integer>1,
R¹ is a group that does not react with magnesium under the conditions of the process,
X¹¹ and X²² are, independently of each other, H, halogen, Sn(R⁰)₃, or straight chain, branched or cyclic alkyl with 1 to 20 C-atoms, which is unsubstituted, mono- or poly-substituted by F, Cl, Br, I, —CN and/or —OH, in which optionally one or more non-adjacent CH₂ groups are replaced, in each case independently from one another, by —O—, —S—, —NH—, —NR⁰—, —SiR⁰R⁰⁰—, —CO—, —COO—, —OCO—, —OCO—O—, —S—CO—, —CO—S—, —CY¹=CY²— or —C≡C— in such a manner that O and/or S atoms are not linked directly to one another, optionally substituted aryl or heteroaryl, or P-Sp,
R⁰ and R⁰⁰ are, independently of each other, H or alkyl with 1 to 12 C-atoms, and
Y¹ and Y² are, independently of each other, H, F, Cl or CN.

27. A process according to claim 26, wherein
X¹¹ and X²² are, independently of each other, alkyl that is optionally substituted with one or more fluorine atoms, alkenyl, alkynyl, alkoxy, thioalkyl, silyl, ester, amino or fluoroalkyl, all of these groups being straight-chain or branched and having 1 to 20 C atoms, or optionally substituted aryl or heteroaryl, or P-Sp,
P is a polymerizable or reactive group which is optionally protected, and
Sp is a spacer group or a single bond.

28. A process according to claim 27, wherein X¹¹ and X²² denote straight-chain or branched alkyl with 1 to 6 C atoms.

29. A process according to claim 26, wherein one or both of X¹¹ and X²² denote a reactive group or a protected reactive group.

30. A process according to claim 29, wherein the polymer of formula I2 is further reacted via end group X¹¹ and/or X²² with the same or a different polymer of formula I2, or with another polymer, to form a block copolymer.

31. A process according to claim 16, wherein one or more of the terminal groups of the polymer are endcapped.

32. A process according to claim 2, wherein the poly (3-substituted thiophene) has a regioregularity of≧98%.

33. A process according to claim 2, wherein the solvent is diethyl ether, di-n-butyl ether, di-n-propyl ether, di-isopropyl ether, ethers with two different alkyl groups, 1,2-dimethyoxyetane or t-butylmethyl ether, or a mixture thereof, or a mixture of toluene with one or more of the above ethers.

34. A process according to claim 33, wherein the solvent is diethyl ether.

35. A process according to claim 2, wherein the amount of the magnesium is>1 to 3 times the molar amount of the thiophene.

36. A process according to claim 35, wherein the amount of the magnesium is 1.02 to 1.20 times the molar amount of the thiophene.

37. A process according to claim 2, wherein unreacted magnesium is removed before adding the catalyst.

38. A process according to claim 2, wherein the catalyst is a Ni(II) catalyst.

39. A process according to claim 1, wherein the catalyst is Ni(dppp)Cl₂ (1,3-diphenylphosphinopropane nickel(II) chloride) or Ni(dppe)Cl₂ (1,2-bis(diphenylphosphino)ethane nickel(II) chloride).

40. A process according to claim 2, wherein a) and d) are carried out at room temperature to reflux temperature.

41. A process according to claim 2, wherein a) and d) are carried out at reflux temperature.

42. A process according to claim 2, wherein the polymer is purified after recovered from the reaction mixture.

43. A process according to claim 2, wherein one or more of the terminal groups of the polymer are endcapped.

44. A process according to claim 2, wherein the 3-substituted thiophene is a 3-substituted 2,5-dibromo-thiophene.

* * * * *